(12) United States Patent
Ogasawara et al.

(10) Patent No.: US 7,255,773 B2
(45) Date of Patent: *Aug. 14, 2007

(54) PLASMA PROCESSING APPARATUS AND EVACUATION RING

(75) Inventors: Masahiro Ogasawara, Yamanashi (JP); Kazuya Kato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/047,595

(22) Filed: Feb. 2, 2005

(65) Prior Publication Data

US 2005/0126488 A1    Jun. 16, 2005

Related U.S. Application Data

(63) Continuation of application No. 10/416,235, filed as application No. PCT/JP01/09634 on Nov. 2, 2001, now Pat. No. 6,878,234.

(30) Foreign Application Priority Data

Nov. 10, 2000 (JP) ............................. 2000-343178

(51) Int. Cl.
    H01L 21/3065 (2006.01)
    C23C 16/00 (2006.01)
    C23C 16/455 (2006.01)

(52) U.S. Cl. ................. 156/345.29; 156/345.43; 156/345.47; 118/715; 118/723 E

(58) Field of Classification Search ................ 118/715, 118/723 E; 156/345.29, 345.43, 345.47
See application file for complete search history.

(56) References Cited

U.S. PATENT DOCUMENTS 4,931,135 A   6/1990  Horiuchi et al.
5,449,410 A   9/1995  Chang et al.
5,522,932 A   6/1996  Wong et al.
5,891,253 A   4/1999  Wong et al.
5,919,332 A   7/1999  Koshiishi et al.
6,051,100 A   4/2000  Walko, II
6,071,372 A   6/2000  Ye et al.
6,106,630 A   8/2000  Frankel
6,176,969 B1  1/2001  Park et al.

(Continued)

FOREIGN PATENT DOCUMENTS

JP          10-027784         1/1998

(Continued)

*Primary Examiner*—Jeffrie R. Lund
(74) *Attorney, Agent, or Firm*—Finnegan Henderson Farabow Garrett & Dunner, L.L.P.

(57) ABSTRACT

A plasma processing apparatus having an evacuation ring with high plasma resistance and capable of minimizing abnormal discharge is provided. A processing chamber 100 includes a ceiling unit 110 at which an upper electrode 112 is provided and a container unit 120 having a lower electrode 122 provided to face opposite the upper electrode 112, on which a substrate can be placed. An evacuation ring 126 is provided around the lower electrode 122 so as to divide the space in the processing chamber 100 into a plasma processing space 102 and an evacuation space 104. At the evacuation ring 126, through holes 126a and blind holes 126b which are fewer than the through holes 126a and open toward the plasma processing space 102 are formed. An insulation coating constituted of $Y_2O_3$ is applied onto the surface of the evacuation ring 126 towards the plasma processing space 102.

20 Claims, 4 Drawing Sheets

U.S. PATENT DOCUMENTS

| | | |
|---|---|---|
| 6,444,083 B1 | 9/2002 | Steger et al. |
| 6,506,685 B2 * | 1/2003 | Li et al. ..................... 438/710 |
| 6,620,520 B2 | 9/2003 | O'Donnell et al. |
| 6,726,801 B2 | 4/2004 | Ahn |
| 6,733,620 B1 | 5/2004 | Sugiyama et al. |
| 6,790,242 B2 | 9/2004 | O'Donnell |
| 6,878,234 B2 * | 4/2005 | Ogasawara et al. .... 156/345.29 |
| 2002/0086153 A1 | 7/2002 | O'Donnell et al. |
| 2002/0086545 A1 | 7/2002 | O'Donnell et al. |
| 2002/0086553 A1 | 7/2002 | O'Donnell et al. |
| 2004/0025788 A1 * | 2/2004 | Ogasawara et al. ......... 118/715 |
| 2004/0060658 A1 | 4/2004 | Nishimoto et al. |
| 2004/0060661 A1 | 4/2004 | Nishimoto et al. |
| 2004/0063333 A1 | 4/2004 | Saigusa et al. |
| 2004/0129218 A1 | 7/2004 | Takahashi et al. |
| 2005/0126488 A1 * | 6/2005 | Ogasawara et al. ...... 118/723 E |

FOREIGN PATENT DOCUMENTS

| | | |
|---|---|---|
| JP | 11-233292 | 8/1999 |
| WO | WO99/45584 | 9/1999 |

* cited by examiner

PLASMA PROCESSING APPARATUS AND EVACUATION RING

CROSS REFERENCE TO RELATED APPLICATIONS

This is a continuation application of application Ser. No. 10/416,235, filed May 8, 2003 now U.S. Pat. No. 6,878,234, which is a national phase application filed under 35 U.S.C. § 371 based on International Application No. PCT/JP01/09634, filed Nov. 2, 2001.

BACKGROUND OF THE INVENTION

The present invention relates to a plasma processing apparatus.

A plasma processing apparatus having an upper electrode and a lower electrode provided to face opposite each other within an airtight processing chamber is widely employed in semiconductor device manufacturing processes in the related art. Such a plasma processing apparatus adopts a structure that enables a specific type of plasma processing to be executed on a substrate with plasma generated from a process gas supplied into the processing chamber by applying high-frequency power to the upper electrode after placing the substrate on the lower electrode.

In addition, an evacuation ring is mounted around the periphery of the lower electrode between the side surface of the lower electrode and the inner wall surface of a processing container, and this evacuation ring divides the space within the processing container into a processing space where the substrate is placed and an evacuation path which communicates with an evacuating mechanism. A plurality of through holes are formed at the evacuation ring, and the processing space and the evacuation path are made to communicate with each other through these through holes. Thus, since the gas within the processing space is guided into the evacuation path via the through holes during the process, the conductance within the processing space and the evacuation path is sustained in a specific state, thereby enabling stable evacuation of the processing space. The plasma is trapped inside the processing space, and a ground area is assured by the inner wall surface of the processing container and the evacuation ring, whose potentials are held at the ground potential level.

However, the evacuation ring, which is constituted of a metal such as an aluminum alloy so as to sustain its potential at the ground potential level, is bound to be damaged by the plasma generated within the processing container. In addition, if a sufficiently large ground area is not assured, an abnormal discharge tends to occur due to an uneven distribution of the plasma inside the processing container or the like. The stability in the electrical discharge is disrupted by such an abnormal discharge and, furthermore, the abnormal discharge causes damage to the substrate, resulting in lowered yield. Moreover, the abnormal discharge damages the inner wall of the processing chamber and the evacuation ring as well.

An object of the present invention, which has been completed by addressing the problems discussed above, is to provide a plasma processing apparatus having an evacuation ring with high plasma resistance and capable of minimizing occurrence of abnormal discharge.

SUMMARY OF THE INVENTION

In order to achieve the object described above, the present invention provides a new and improved plasma processing apparatus comprising a processing chamber, a first electrode provided inside the processing chamber, upon which a substrate can be placed, a second electrode provided inside the processing chamber to face opposite the first electrode, a process gas supply system capable of supplying a process gas into the processing chamber, an evacuation system capable of evacuating the processing chamber and a high-frequency power supply system that applies high-frequency power to at least either the first electrode or the second electrode to generate plasma from the process gas and enable a specific type of plasma processing to be executed on the substrate. In addition, the present invention provides a new and improved evacuation ring that is provided between a plasma processing space and an evacuation space in the processing chamber.

In a plasma processing apparatus achieved in a first aspect of the present invention, the object described above is achieved by providing an evacuation ring around the first electrode so as to divide the space in the processing chamber into a plasma processing space and an evacuation space and by forming through holes and blind holes at the evacuation ring.

A second aspect of the present invention provides a plasma processing apparatus characterized in that an evacuation ring having a plurality of through holes formed therein is provided around the first electrode so as to divide the space in the processing chamber into a plasma processing space and an evacuation space with an insulation coating applied onto the surface of the evacuation ring toward the plasma processing space.

In addition, an evacuation ring achieved in a third aspect of the present invention is characterized in that through holes and blind holes are formed therein.

An evacuation ring achieved in the fourth aspect of the present invention is characterized in that an insulation coating is applied onto its surface toward the plasma processing space.

To describe the features of the present invention in further detail, the number of through holes may be larger than the number of blind holes. The insulation coating may be constituted of at least either $Y_2O_3$ or $Al_2O_3$. The openings of the through holes and/or the blind holes may assume a tapered shape so as to allow them to open widely toward the processing chamber.

According to the present invention, in which blind holes are formed as well as through holes at the evacuation ring, the extent of plasma leak can be minimized and a large ground area can be assured. In addition, the plasma leak can be even more effectively prevented with the insulation coating. Since both $Y_2O_3$ and $Al_2O_3$ achieve a high degree of plasma erosion resistance, the insulation coating constituted of either of these materials improves the yield by preventing any damage from occurring readily within the processing container and reducing both metal contamination and dust generation and requiring less frequent maintenance of the processing apparatus. By forming the holes with a gently tapered shape opening widely toward the processing chamber, an even larger ground area can be assured and, since the internal diameter of the holes does not become too small for a considerable length of time even if an adhering substance generated during the process becomes deposited at the openings toward the processing chamber, the maintenance cycle can be extended.

DETAILED DESCRIPTION OF THE PREFERRED EMBODIMENTS

The following is a detailed explanation of the preferred embodiments of the plasma etching processing apparatus according to the present invention, given in reference to the attached drawings.

(1) Overall Structure of Etching Apparatus

Figure 1:
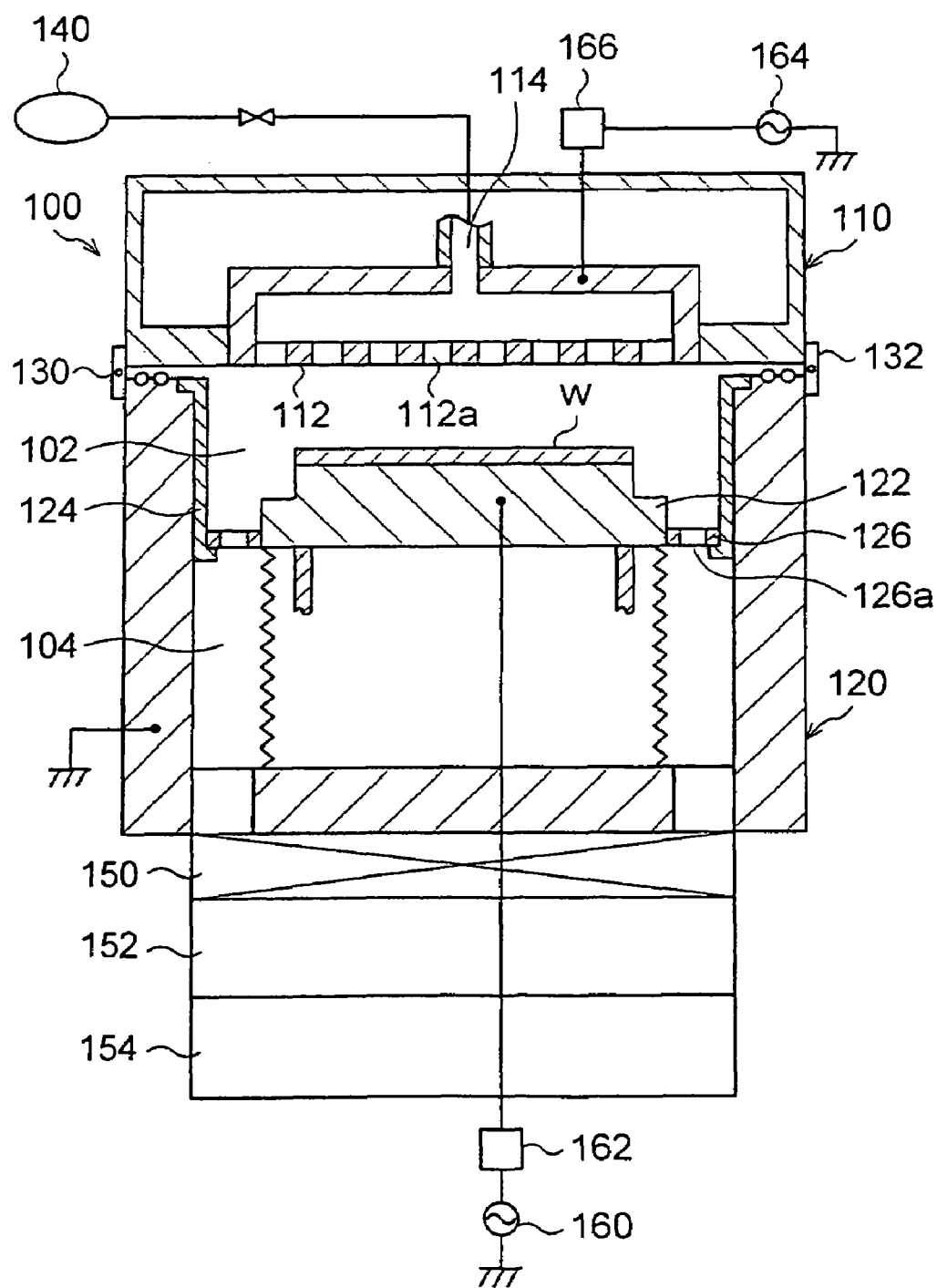
FIG. 1 is a schematic sectional view of an etching apparatus in which the present invention may be adopted.

First, the structure of the etching apparatus is briefly explained. As shown in FIG. 1, a processing chamber 100 includes a ceiling unit 110 and a substantially cylindrical electrically conductive container unit 120 having an open top. The ceiling unit 110 is detachably fixed to the container unit 120 by a locking mechanism 130, and thus, the processing chamber 100 can be opened/closed freely. Inside the container unit 120, an electrically conductive lower electrode 122 on which a substrate such as a semiconductor wafer (hereafter referred to as a "wafer") W is placed is provided. At the ceiling unit 110, an upper electrode 112 is provided to face opposite the lower electrode 122.

A plurality of gas outlet holes 112a are formed at the upper electrode 112 to let out a process gas into a plasma processing space 102. The outlet holes 112a are connected to a gas supply source 140 through a gas supply path 114. Thus, the process gas is supplied from the gas supply source 140 into the plasma processing space 102 via the outlet holes 112b.

In addition, an evacuation ring 126 is provided around the lower electrode 122 toward its bottom. The evacuation ring 126 separates the plasma processing space 102 from an evacuation space 104. As described in detail later, a plurality of through holes 126a and a plurality of blind holes (non-through holes) 126b are formed at the evacuation ring 126. The plasma processing space 102 above the evacuation ring 126 and the evacuation space 104 below the evacuation ring 126 are allowed to communicate with each other through the through holes 126a. Thus, the gas inside the plasma processing space 102 travels through the through holes 126a at the evacuation ring 126 and is then evacuated as necessary by a turbo-molecular pump 154 via an evacuation quantity regulating valve 152.

High-frequency power output from a high-frequency source 160 is applied to the lower electrode 122 via a matcher 162. High-frequency power output from a high-frequency source 164 is applied to the upper electrode 112 via a matcher 166. With the power applied to the electrodes, the process gas having been supplied into the processing chamber 100 is raised to plasma and a specific type of etching processing is executed on the wafer W with the plasma.

A deposition shield 124 is provided at the inner wall of the container unit 120 in the plasma processing space 102 by coating the inner wall surface with $Y_2O_3$ or the like. By applying the $Y_2O_3$ coating with high plasma resistance, it is ensured that the inner wall surface of the processing chamber does not become etched by the plasma etchant to create particles.

An electrically conductive O-ring 132 is inserted between the ceiling unit 110 and the container unit 120. A ground path is formed to extend from the upper electrode 112 via the container unit 120, and the conductive O-ring 132 constitutes part of the ground path. As the container unit 120 is evacuated, the conductive O-ring 132 becomes compressed and, as a result, the ceiling unit 110 and the container unit 120 are allowed to be locked to each other even more closely, thereby achieving reliable grounding.

(2) Structure of the Evacuation Ring

Figure 2A:
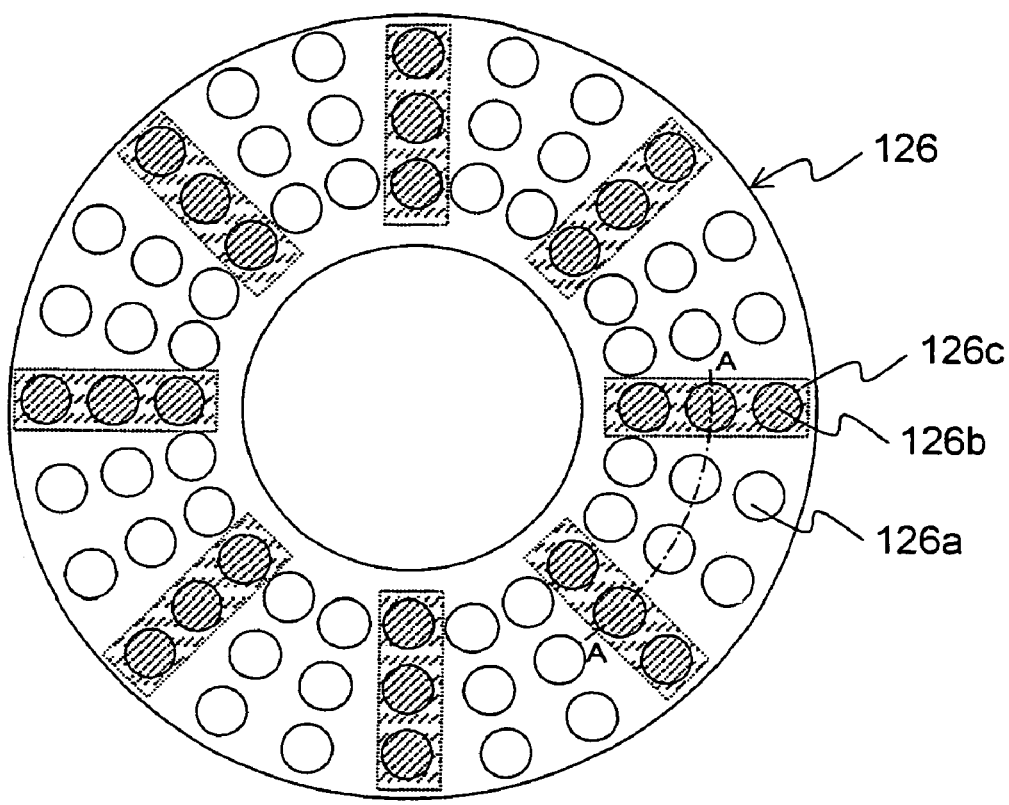
FIG. 2A is a plan view of the evacuation ring achieved in an embodiment of the present invention, viewed from the processing space side
Figure 2B:
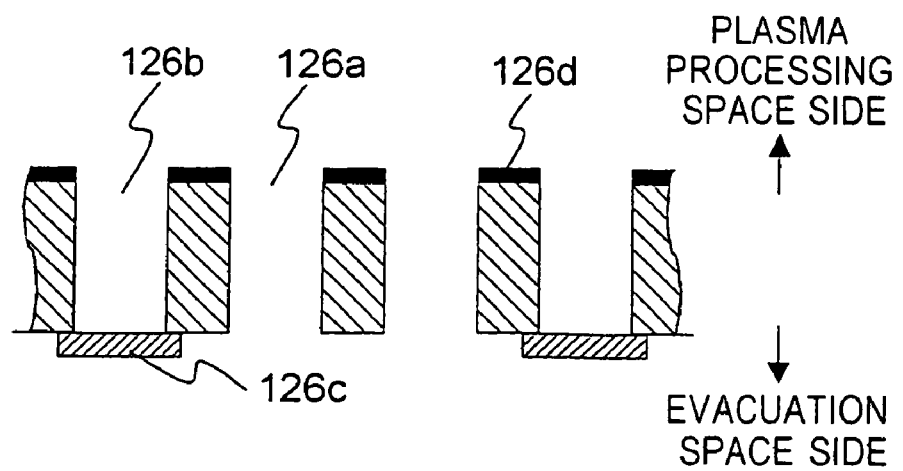
FIG. 2B is its sectional view taken along line A-A.

Next, in reference to FIG. 2, the evacuation ring 126 achieved in the embodiment is described in detail. FIG. 2A is a plan view of the evacuation ring 126 viewed from the processing space side. FIG. 2B is a sectional view of the evacuation ring 126 taken along line A-A.

The plurality of through holes 126a are formed in a radial pattern at the evacuation ring 126. ⅓ of these through holes 126a are sealed on the side toward the evacuation space 104 by attaching a sealing member thereto. The sealed holes form blind holes 126b that only open toward the plasma processing space 102. A kapton tape 126c is used as the sealing member in this example. Since some of the through holes are converted to non-through blind holes 126b and thus fewer through holes 126a are present at the evacuation ring 126 than at an evacuation ring in the related art, a larger ground area is achieved.

In addition, a $Y_2O_3$ coating 126d is applied as an insulation coating at the surface of the evacuation ring 126 toward the processing space. The thickness of the $Y_2O_3$ coating 126d is set within a range of 50~100 μm in this example. Since $Y_2O_3$ achieves high plasma erosion resistance, the presence the he coating prevents any damage from occurring readily inside the processing container and reduces both metal contamination and dust generation. As a result, the yield is improved and, at the same time, the frequency of maintenance work on the apparatus can be reduced. Alternatively, $Al_2O_3$ or the like may be used to form the insulation coating.

Figure 3:
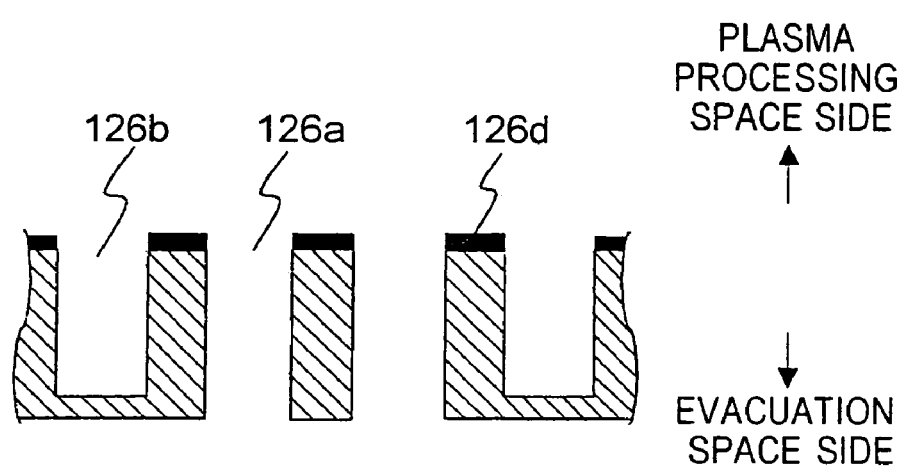
FIG. 3 is a sectional view of the evacuation ring achieved in a variation of the embodiment of the present invention.

The blind holes 126b may be formed through a method other than that described above. For instance, a separate plate with no holes punched therein may be bonded over areas where blind holes 126b are to be formed from some of the through holes 126a formed at the evacuation ring 126. Alternatively, an evacuation ring originally formed with through holes 126a and blind holes 126b may be formed through integral molding or machining, as shown in FIG. 3. It is to be noted that the blind holes should have the largest possible inner area in order to assure a large enough surface area for grounding.

Figure 4:
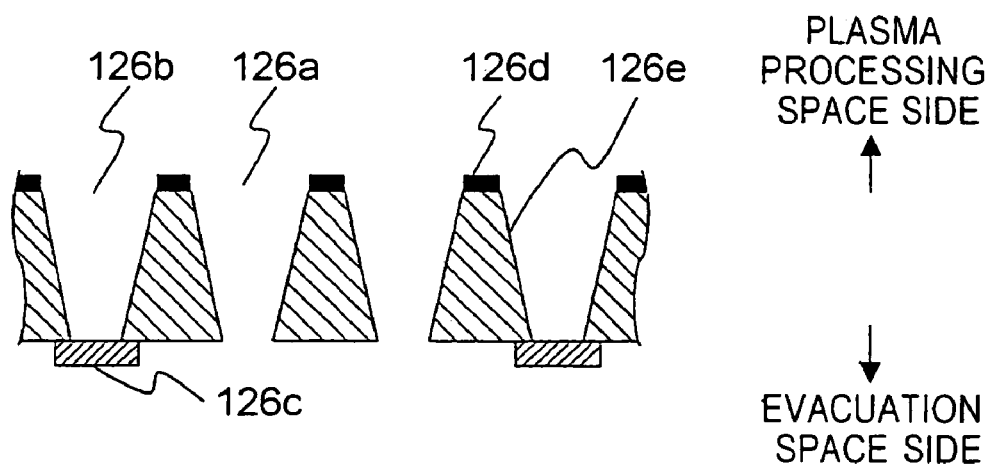
FIG. 4 is a sectional view of the evacuation ring achieved in another embodiment of the present invention.

FIG. 4 is a sectional view of the evacuation ring achieved in another embodiment. In this embodiment, the through holes 126a and the blind holes 126b assume a tapered shape 126e so as to allow them to open widely toward the processing chamber. Other structural features are identical to those of the embodiment described earlier. By assuming such a tapered shape, the internal diameter of the holes does not readily become too small since any adhering substance generated during the process is made to become gradually deposited over the tapered surfaces of the openings opening toward the processing chamber. As a result, the maintenance cycle of the evacuation ring 126 can be extended to improve the throughput.

Figure 5A:
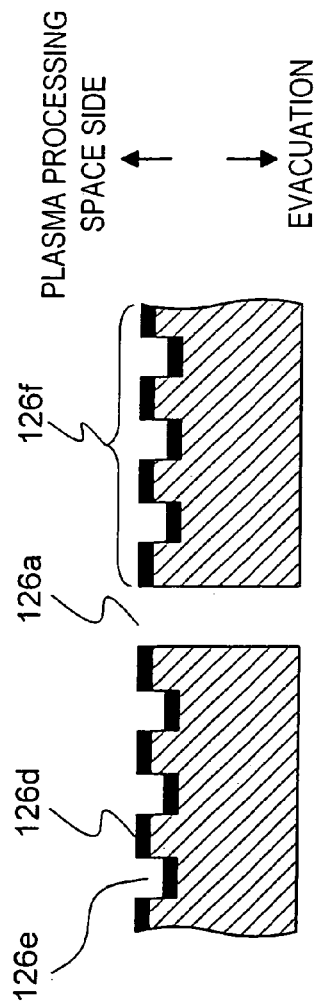
FIG. 5A-5C presents sectional views of the evacuation rings achieved in further embodiments of the present invention.

FIG. 5 presents sectional views of the evacuation rings achieved in further embodiments. In the embodiment shown in FIG. 5A, the evacuation ring includes through holes 126a and indentations 126f. These indentations 126f are formed by forming numerous non-through holes 126e having a diameter of that is approximately half the diameter of the through holes 126a and a depth that is approximately ⅕ the depth of the through holes 126a toward the plasma processing space in the embodiment. Since the diameter and the depth of these non-through holes are smaller than those of the non-through holes 126b shown in FIGS. 2 and 3, a desired ground area is achieved by forming a greater number of non-through holes. A $Y_2O_3$ coating 126d similar to that in the previous embodiments is applied onto the surface of the evacuation ring 126 toward the processing space. By forming indentations at the surface toward the processing space as described above, a large ground area is achieved and the non-through holes 126d with a smaller depth can be formed with greater ease.

Figure 5B:
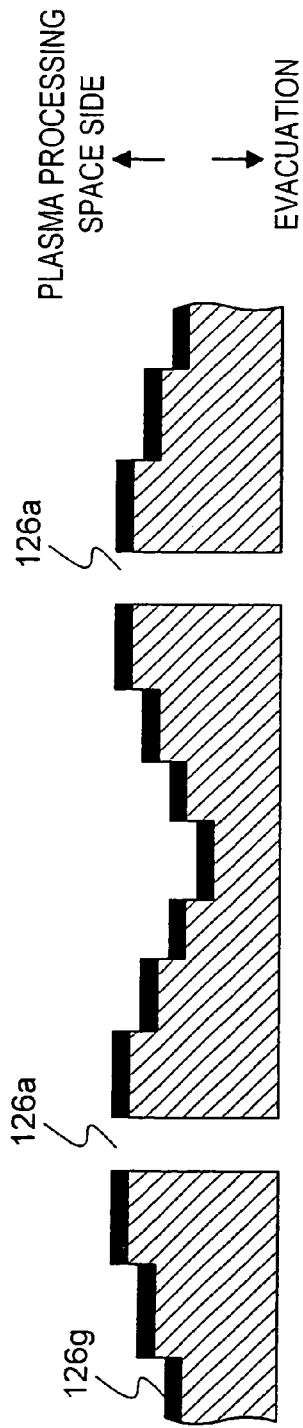
Figure 5C:
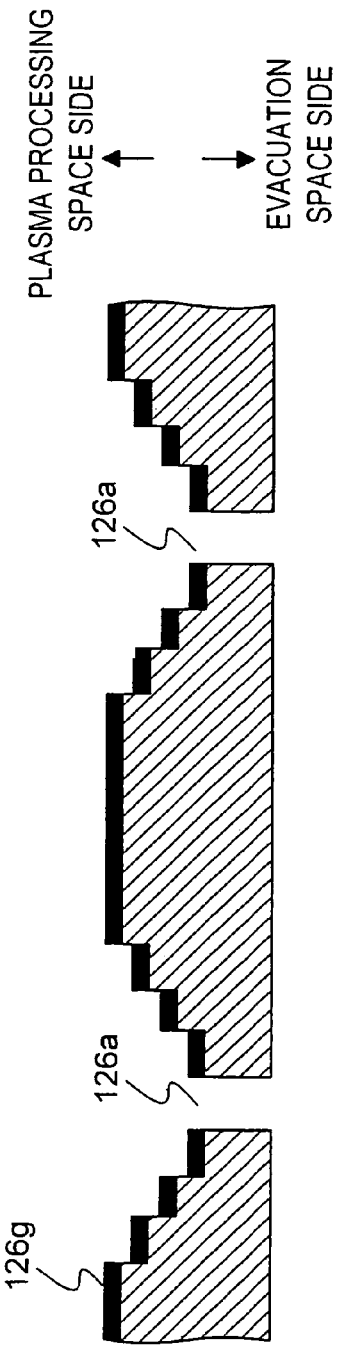

The embodiments shown in FIGS. 5B and 5C each include indentations 126g having vertical and horizontal stages to form steps instead of the indentations 126f shown in FIG. 5A. Other structural features are identical to those shown in FIG. 5A. The embodiments shown in FIGS. 5B and 5C, too, achieve advantages similar to those of the embodiment shown in FIG. 5. It is to be noted that in each of the embodiments shown in FIGS. 5A, 5B and 5C, the through holes 126a may assume a tapered shape 126e so as to open widely toward the processing chamber, and the indentations 126g may assume a smooth curve instead of having vertical and horizontal stages to form steps.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

The shapes of the through holes and the blind holes, their positions, the tapered shape and the shapes of the indentations are not limited to those adopted in the embodiments described above, and numerous alternatives may be adopted instead. The present invention is applicable to any of such variations. For instance, while the through holes and the blind holes are formed as circular, round holes in a plan view in the embodiments described above, the shape of the holes is not limited to this example and they may be formed as elongated holes or as short slits. In addition, while the number of blind holes is ⅓ of the entire number of original through holes in the embodiments described above, the number of blind holes is not limited to this example.

The present invention may be adopted in various processing apparatuses including magnetron plasma etching apparatuses and plasma CVD apparatuses as well as the plane parallel apparatus described above.

As explained in detail above, according to the present invention in which through holes and blind holes are formed at the evacuation ring, the extent of plasma leak is minimized and a larger ground area is achieved to prevent the occurrence of an abnormal discharge. As a result, the substrate is not damaged readily and the yield is improved over the related art. At the same time, the damage to the inner wall of the processing chamber and the evacuation ring is reduced. In addition, by forming an insulation coating such as $Y_2O_3$ at the evacuation ring, damage within the processing container is minimized and the extents of metal contamination and dust generation are lowered to improve the yield and the maintenance frequency can be reduced. Furthermore, by adopting a tapered shape at the through holes and the blind holes so as to allow them to open widely toward the processing chamber, any adhering substance generated during the process is made to become gradually deposited over the tapered surfaces at the openings opening toward the processing chamber and thus, the internal diameter of the holes does not readily become too small. As a result, both the length of time over which the processing can be executed continuously and the evacuation ring maintenance cycle can be extended to improve the throughput.

The present invention may be adopted in a plasma processing apparatus employed during semiconductor device manufacturing processes and an evacuation ring provided in the plasma processing apparatus.

What is claimed is:

1. A plasma processing apparatus comprising:
   a processing chamber;
   a first electrode provided inside said processing chamber, upon which the substrate can be placed;
   a second electrode provided inside said processing chamber to face opposite said first electrode;
   a process gas supply system capable of supplying a process gas into said processing chamber;
   an evacuation system capable of evacuating said processing chamber; and
   a high-frequency power supply system that applies high-frequency power to at least either said first electrode or said second electrode to generate plasma from the process gas and enable some of specific types of plasma processing to be executed on the substrate, wherein:
   an evacuation ring is provided around said first electrode so as to divide said processing chamber into a plasma processing space and an evacuation space with through holes and blind holes formed at said evacuation ring, and
   said through holes and/or said blind holes are formed as circular, round holes.

2. A plasma processing apparatus according to claim 1, wherein:
   the number of said through holes is greater than the number of said blind holes.

3. A plasma processing apparatus according to claim 1, wherein:
   said blind holes open toward said processing chamber.

4. A plasma processing apparatus according to claim 1, wherein:
   the openings of said through holes and/or said blind holes assume a tapered shape so as to allow said through holes and/or said blind holes to open widely toward said processing chamber.

5. A plasma processing apparatus according to claim 1, wherein:
   said through holes and/or said blind holes are formed in a staircase pattern with reducing diameter.

6. A plasma processing apparatus according to claim 1, wherein:
   an insulation coating is applied onto the surface of said evacuation ring toward said plasma processing space.

7. A plasma processing apparatus according to claim 6, wherein:
   said insulation coating is constituted of at least one of $Y_2O_3$ and $Al_2O_3$.

8. A plasma processing apparatus according to claim 1, wherein:
said blind holes are formed at a surface of said evacuation ring.

9. A plasma processing apparatus according to claim 1, wherein:
said through holes and/or said blind holes are formed as elongated holes.

10. A plasma processing apparatus according to claim 1, wherein:
said through holes and/or said blind holes are formed as slits.

11. An evacuation ring provided between a plasma processing space and an evacuation space in a processing chamber, having:
through holes and blind holes formed therein,
said through holes and/or said blind holes are formed as circular, round holes.

12. An evacuation ring according to claim 11, wherein:
the number of said through holes is greater than the number of said blind holes.

13. An evacuation ring according to claim 11, wherein:
said blind holes open toward said processing chamber.

14. An evacuation ring according to claim 11, wherein:
the openings of said through holes and/or said blind holes assume a tapered shape so as to allow said through holes and/or said blind holes to open widely toward said processing chamber.

15. An evacuation ring according to claim 11, wherein:
said through holes and/or said blind holes are formed in a staircase pattern with reducing diameter.

16. An evacuation ring according to claim 11, wherein:
an insulation coating is applied onto a surface of said evacuation ring toward said plasma processing space.

17. An evacuation ring according to claim 16, wherein:
said insulation coating is constituted of at least one of $Y_2O_3$ and $Al_2O_3$.

18. An evacuation ring according to claim 11, wherein:
said blind holes are formed at a surface of said evacuation ring.

19. An evacuation ring according to claim 11, wherein:
said through holes and/or said blind holes are formed as elongated holes.

20. An evacuation ring according to claim 11, wherein:
said through holes and/or said blind holes are formed as slits.

* * * * *